United States Patent [19]

Honda et al.

[11] 4,340,902

[45] Jul. 20, 1982

[54] SEMICONDUCTOR DEVICE

[75] Inventors: Norio Honda; Takehisa Sugahara, both of Kawasaki, Japan

[73] Assignee: Fujitsu Limited, Kawasaki, Japan

[21] Appl. No.: 128,354

[22] PCT Filed: Oct. 2, 1978

[86] PCT No.: PCT/JP78/00004
§ 371 Date: Jul. 18, 1979
§ 102(e) Date: Jul. 12, 1979

[87] PCT Pub. No.: WO79/00302
PCT Pub. Date: May 31, 1979

[30] Foreign Application Priority Data

Nov. 18, 1977 [JP] Japan .................................. 52-138486

[51] Int. Cl.³ .................... H01L 23/02; H01L 23/12; H01L 39/02
[52] U.S. Cl. ........................................ 357/74; 357/81; 357/80; 174/52 R
[58] Field of Search ................ 357/74, 81, 80; 174/52

[56] References Cited

U.S. PATENT DOCUMENTS

| | | | |
|---|---|---|---|
| 3,223,903 | 12/1965 | Solomon | 357/74 |
| 3,265,805 | 8/1966 | Carian et al. | 357/81 |
| 3,399,332 | 8/1968 | Savolainen | 357/81 |
| 3,460,002 | 8/1969 | Mesier | 357/81 |
| 3,492,586 | 1/1970 | Leffmann | 357/81 |
| 3,829,598 | 8/1974 | Darnell | 357/81 |
| 3,946,428 | 3/1976 | Anazawa et al. | 357/81 |
| 3,999,285 | 12/1976 | Lewis et al. | 357/74 |
| 4,025,997 | 5/1977 | Gernitis et al. | 357/81 |
| 4,115,837 | 9/1978 | Beall et al. | 357/74 |
| 4,227,036 | 10/1980 | Fitzgerald | 357/81 |

FOREIGN PATENT DOCUMENTS 51-28960 3/1976 Japan .................................. 357/74

Primary Examiner—Andrew J. James
Attorney, Agent, or Firm—Staas & Halsey

[57] ABSTRACT

A semiconductor device having a semiconductor chip (102), a ceramic base (101), a ceramic frame (105) and a cover (106). The ceramic base (101) is formed with a through hole. One side of said hole is covered by a high-heat conductivity metal plate (100). Said semiconductor chip (102) is mounted through a molybdenum plate (110) on the bottom of a recess formed by one side of said high-heat conductivity metal plate (100) and said through hole. A cooling means (107,108) is secured on said high-heat conductivity metal plate (100) opposite to the side for receiving the semiconductor chip (102).

7 Claims, 5 Drawing Figures

SEMICONDUCTOR DEVICE

DESCRIPTION

1. Technical Field

The present invention relates to a semiconductor device and more particularly to a semiconductor device with an improved heat radiating ability.

2. Background Art

Recently, integration of a semiconductor device and an electric-circuit device packaged therewith have been improved a great deal. As a result, power consumption per unit area of the semiconductor has greatly increased. A high power semiconductor device generates much heat. Accordingly, sufficient heat radiating from a semiconductor chip, i.e. sufficient cooling of the semiconductor device, becomes a requisite condition to improve the semiconductor device and the electric-circuit device.

FIG. 1 of the drawings illustrates a first example of the prior art (U.S. Pat. No. 3,872,583). In FIG. 1 a semiconductor device such as a package for a large scale integrated circuit (LSI) chip is illustrated.

The device illustrated in FIG. 1 comprises a ceramic base 11, a semiconductor chip 12, a metalized lead pattern 13, external connecting terminals 14, a ceramic frame 15, a cover 16, a cylindrical cooling stud 17 and cooling fin assembly 18. The semiconductor chip 12 is received within a central recess provided on one of the major surfaces of the ceramic base 11, and is secured onto said ceramic base by way of soldering. The lead wires extended from wire bonding pads of the semiconductor chip 12 are bonded to the inner extremities of the metalized lead pattern 13 and then the outer extremities of the pattern 13 are connected to the external connecting terminals 14. The cover 16 is secured on the ceramic frame 15 so as to hermetically enclose the semiconductor chip 12 within the recess. The cooling stud 17 is secured to a metalized layer provided on the other major surface of the ceramic base 11 and, then, the cooling fin assembly 18 is press-fitted around the stud 17 so as to be firmly fixed thereon.

In the semiconductor device having the package structure, described above, which is incorporated with the semiconductor chip, heat generated in the semiconductor chip 12 during operation, is transferred to the stud 17 and to the fin assembly 18 via the ceramic base 11. However, since the thermal conductivity of ceramic is rather low, sufficient cooling through the ceramic base 11 can not be expected. On the other hand, the semiconductor chip 12 and the ceramic base 11 or the ceramic base 11 and the cooling stud 17 are strongly secured to each other. Accordingly, when thermal stresses are caused in the ceramic base 11, based on the difference in the thermal expansion coefficients of the ceramic base 11 and the radiating stud 17, the ceramic base 11 together with the semiconductor chip 12 are apt to be cracked. Also, in a case where the fin assembly 18 is designed to be firmly secured on the stud 17 by press-fitting alone, a required accuracy in press-fitting between the inside diameter of the fin assembly 18 and the outside diameter of the stud 17 must be on the order of 1/100 mm. When the fin assembly 18 is press-fitted with such high-accuracy on the stud 17, a large mechanical pressure will be applied to the ceramic base 11 and the external connecting terminals 14, and will often cause the ceramic base to be destroyed and the terminals to be deformed.

In order to eliminate the above described drawbacks, the applicant of the present invention has provided the following described semiconductor device. FIG. 2 of the drawings illustrates a second example of the prior art (Japanese Laid open Patent Application No. 50-139,674). In FIG. 2, a semiconductor device, which has a semiconductor chip in a through hole provided substantially in a central portion of a ceramic base, comprises a beryllia plate which covers one side of the through hole and which is secured to one of the major surfaces of the ceramic base; the semiconductor chip being secured through an oxygen-free copper plate and a molybdenum plate to the bottom of the recess formed by one side of the beryllia plate and the through hole of the ceramic base; a cooling stud being secured to the other side of the beryllia plate through another oxygen-free copper plate; the cooling stud being provided with the cooling fin assembly by way of screw engaging, and; external connecting terminals being provided on the other major surface of the ceramic base and connected to the wire bonding pads of the semiconductor chip.

In the figure, the device comprises a ceramic base 21, a semiconductor chip 22, a metalized lead pattern 23, external connecting terminals 24, a ceramic frame 25, a cover 26, a cooling stud 27, the cooling fin assembly 28, a beryllia plate 29 (beryllia oxide: BeO) metalized on both sides, a molybdenum plate 30 and the oxygen-free copper plates 31, 31'. The semiconductor chip 22 in a through hole, provided in the central portion of the ceramic base 21, is secured on the beryllia plate 29, which is secured on one of the major surfaces of the ceramic base 21 through the molybdenum plate 30 and the oxygen-free copper plate 31. The lead wires, made of, for example, aluminum, from the wire bonding pads of the semiconductor chip 22 are bonded to the inner extremities of the metalized lead pattern 23, electroplated with, for example, gold, on the surface of a tungsten layer, and then the outer extremities of the pattern 23 are connected to the external connecting terminals 24, made of, for example, KOVAR. The cover 26, made of, for example, KOVAR, is secured on the ceramic frame 25 with a metalized surface so as to hermetically enclose the semiconductor chip 22 within the recess. The cooling stud 27 is secured to the other surface of the beryllia plate 29 through the oxygen-free copper plate 31'. The cooling stud 27 is prethreaded with male threads. The cooling fin assembly 28, having female threads therein, are screwed on said cooling stud 27.

In the above mentioned semiconductor device, heat generated from the semiconductor chip during operation, is transferred from the molybdenum plate to the oxygen-free copper plate to the beryllia plate to the oxygen-free copper plate to the cooling stud and, finally to the cooling fin assembly. Since the thermal expansion coefficients of the semiconductor chip and the molybdenum are generally equal, no crack is caused in the semiconductor chip. The beryllia plate has better thermal conductivity than that of the ceramic base. As a result, heat generated in the semiconductor chip can be satisfactorily transferred to the cooling stud. Since the engagement between the cooling stud and cooling fin assembly is achieved in a conventional manner, there is no requirement to utilize highly accurate processing. Furthermore, since the installation and removal of the cooling fin assembly is very easy, there is no pressure applied on the ceramic base or the external connecting terminals which would deform or destroy them during the assembly operation.

As described above, the semiconductor device which was proposed by the applicant of the present invention, has many advantages. However, in this device beryllia is used as the material of a supporting member for the semiconductor chip, and also, the cooling stud and the cooling fin assembly must be manufactured independently. As a result the device has a rather high manufacturing cost. In addition, recently, it was found that the raw material of beryllia is dangerous to the health of operators; therefore, in the near future, it is predicted that beryllia will be prohibited from being used in semiconductor devices for this very reason.

DISCLOSURE OF THE INVENTION

It is a primary object of the present invention to obviate the above-mentioned disadvantages by providing an improved structure of a semiconductor device and an electric-circuit device packaged therewith.

Another object of this invention is to provide a cheaper semiconductor device as compared to the prior-art device, wherein heat from the semiconductor chip can be satisfactorily transferred to the surroundings.

Another object of this invention is to provide a cheaper semiconductor device as compared to the prior-art device, wherein neither mechanical nor thermal stresses are placed on the constructing elements of the semiconductor chip.

Another object of this invention is to provide a semiconductor device which is reliable in operation and can receive a semiconductor chip of high power and of high-integration.

The above object are accomplished due to the fact that in a semiconductor device having a semiconductor chip in a through hole provided substantially in the central portion of a ceramic base, according to the present invention, an improvement is provided with comprises: a high-heat conducting metal plate which covers one side of the through hole and which is secured to one of the major surfaces of the ceramic base; the high-heat conducting metal plate being a laminated single unitary structure formed by a ductile metal plate and a molybdenum plate; the semiconductor chip being secured through a molybdenum plate onto the bottom of a recess formed by means of one side of the high-heat conducting metal plate and the through hole of the ceramic base; a cooling means being bonded to the other side of the high-heat conducting metal plate, and; external connecting terminals being provided on the other major surface of the ceramic base and connected to the wire bonding pads of the semiconductor chip.

In the present invention, the high-heat conducting metal plate is laminated into a single unitary structure formed by the molybdenum plate and the metal plate of ductile materials, such as oxygen-free copper.

It would seem that, since the difference between the thermal expansion coefficients of molybdenum and ceramic is small the molybdenum plate could be advantageously used to cover and secure the through hole provided on the ceramic base. However, molybdenum and ceramic each has very strong rigidity and, therefore, when these two materials are secured to each other, they cannot withstand even a small difference in thermal expansion coefficients. As a result, after the molybdenum plate is secured to the ceramic base and repeated heating and cooling is applied thereto, mechanical strains are caused on the mechanically weaker ceramic base which result in the cracking of the ceramic base.

According to the present invention, in order to mitigate the mechanical and thermal stresses between ceramic and molybdenum, a metal of ductile material, such as oxygen-free copper, is placed between the ceramic base and the molybdenum plate. Metals such as gold, silver or nickel can be utilized as the ductile metal, however, the using of such metals is not advantageous from the point of view of price.

In the present invention, in addition to the abovementioned molybdenum plate, a molybdenum plate is also placed between the oxygen-free copper plate and the semiconductor chip which is to be mounted on the oxygen-free copper plate.

BEST MODE FOR CARRYING OUT THE INVENTION

A preferred embodiment of the invention will be described in detail below with reference to the accompanying drawings.

Figure 1:
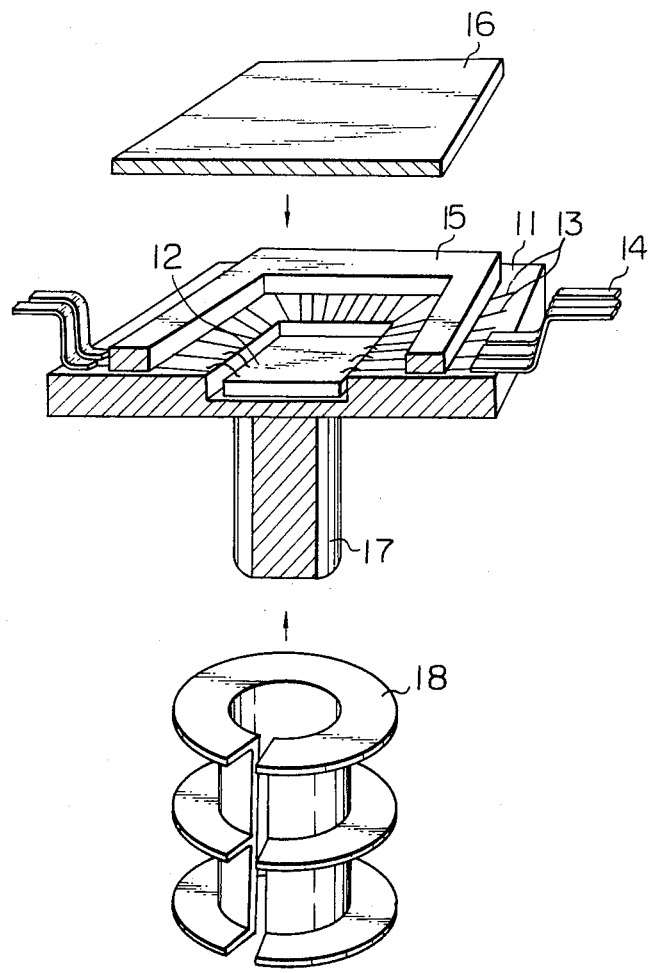
FIGS. 1 and 2 are exploded perspective views, with portions broken away, of the semiconductor devices of the prior-art devices.
Figure 2:
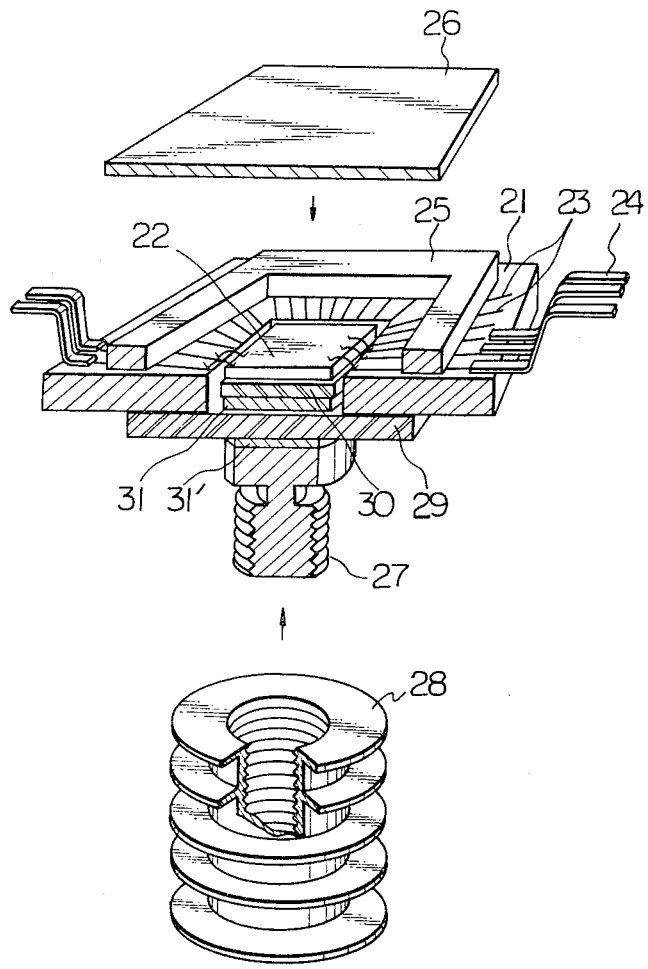
Figure 3:
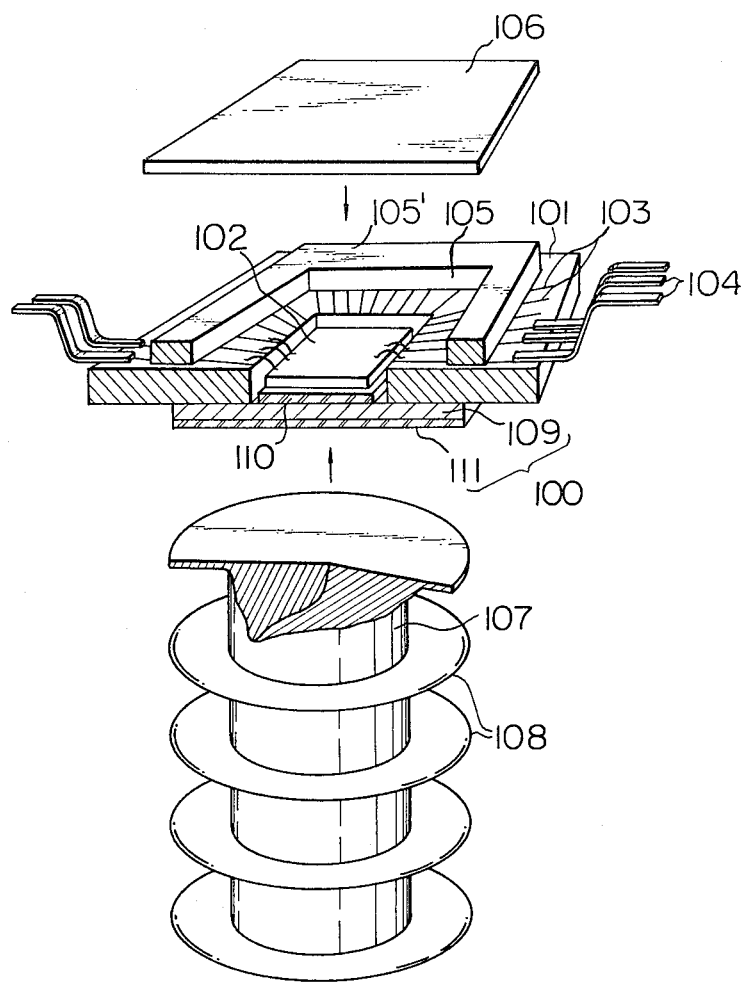
FIG. 3 is an exploded perspective view, with portions broken away, of the structure of a semiconductor device according to the present invention.
Figure 4:
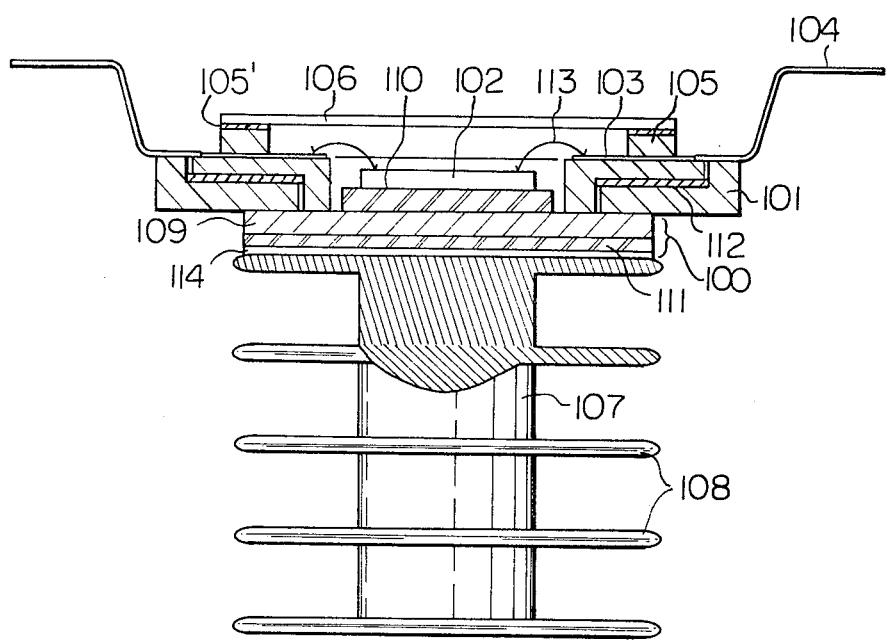
FIG. 4 is a longitudinal sectional view of FIG. 3.

Referring to the drawings, and more particularly to FIGS. 3 and 4, a semiconductor device according to the present invention comprises a ceramic base 101, a semiconductor chip 102, a metalized lead pattern 103, external connecting terminals 104, a ceramic frame 105, a cover 106, a cooling stud 107, cooling fins 108, a molybdenum plate 110, and a high-heat conductivity metal plate 100 being a laminated single unitary structure formed by a ductile metal plate 109 such as an oxygen-free copper plate and a molybdenum plate 111. The ceramic base 101 is formed as a multi-layered ceramic structure, between the layers of which a conducting layer 112 for ground is formed.

The semiconductor chip 102 is received within a through hole provided in the central portion of the ceramic base 101, and is secured through the molybdenum plate 110 on the high-heat conductivity metal plate 100, so that the copper plate 109 of the high-heat conductivity metal plate 100 is secured to one of the major surfaces of the ceramic base 101. As a result, the semiconductor chip 102 is connected to at least one external connecting terminal 104 through the copper plate 109 and the conducting layer 112 adjacent thereto.

One end of each of the lead wires 113, made of, for example, aluminum, is connected to one of the wire bonding pads formed on the top surface of the semiconductor chip 102, and the other end of each of the lead wires 113 is bonded to one of the inner extremities of the metalized lead pattern 103 screen-printed on the other major surface of the ceramic base 101. The metalized lead pattern 103 is formed of tungsten with, for example, gold plating. Each of the outer extremities of the metalized lead pattern 103 can be connected to each one of the external connecting terminals 104, formed of such as KOVAR, respectively.

The ceramic frame 105, which has a metalized layer 105' thereon, is secured to the other major surface of the ceramic base 101 through the metalized lead pattern 103. At least some parts of the matalized lead pattern 103 are covered by the ceramic frame 105. After the ceramic frame 105 is secured to the ceramic base 101, the cover 106, formed of, for example, KOVAR, is secured to the metalized layer 105' of the ceramic frame 105 so as to hermetically enclose the semiconductor chip 102 within the ceramic base 101.

Each outer extremity of the external connecting terminals 104 extends beyond the surface of the cover 106 in a direction away from the other major surface of the ceramic base 101. The cooling stud 107, formed of suitable material such as aluminum is bonded onto the other surface of the high-heat conductivity plate 100. The bonding is achieved by means of an adhesive 114, such as epoxy. The cooling stud 107 is preformed with the cooling fins 108 in the form of a single unitary structure. Each of the fins 108 are arranged about the cooling stud 107 in the form of a concentric circle. As mentioned above, since the high-heat conductivity metal plate 100 is formed by the molybdenum plate 111 and the ductile metal plate 109, thermal deformation of the molybdenum plate and the ductile metal plate is apt to be caused by means of a bimetal-action developed between them. In order to eliminate such bimetal-action, another ductile metal plate (not shown) may be utilized between the molybdenum plate 111 and the cooling stud 107.

Figure 5:
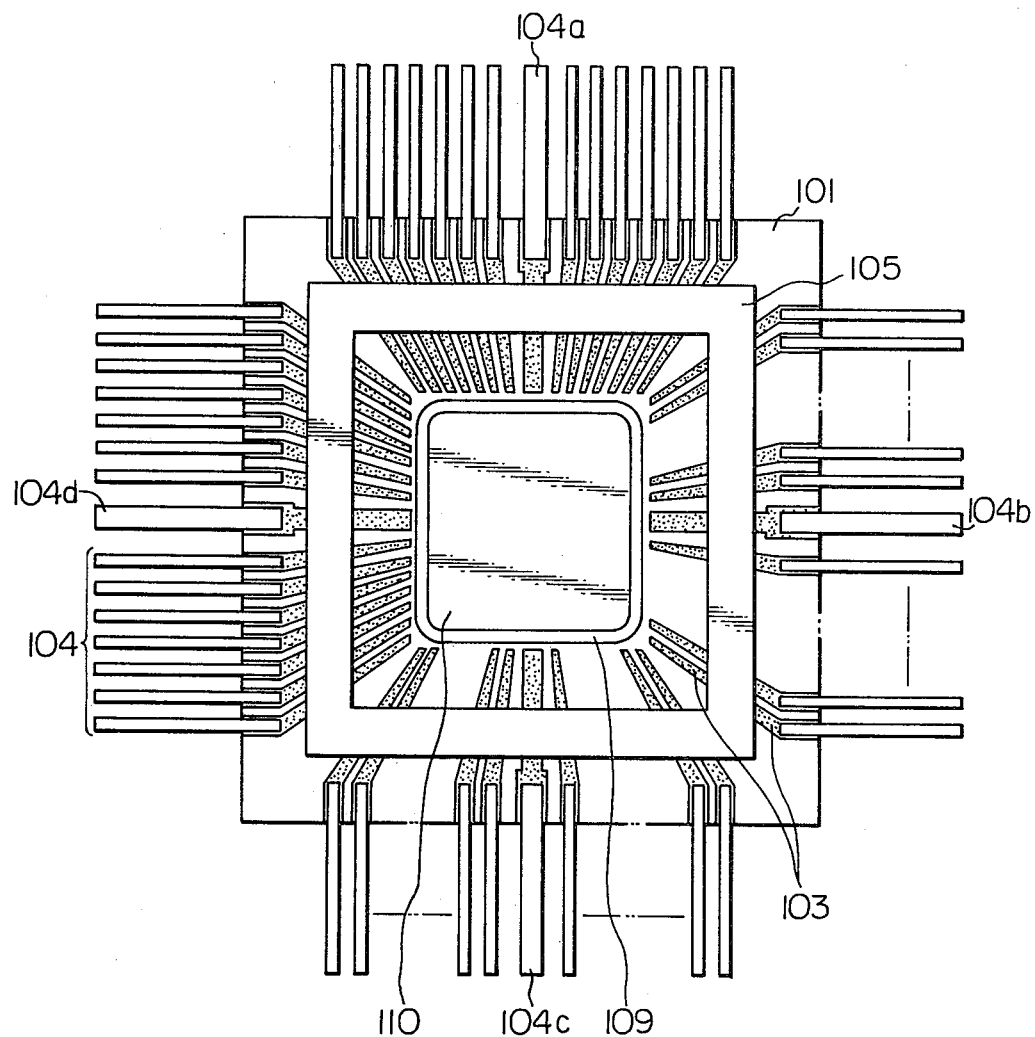
FIG. 5 is a plan view of FIG. 3, in which the cover and the semiconductor chip are omitted.

As can be seen in FIG. 5, according to the present invention, the through hole opening in the ceramic base 101, which receives the semiconductor chip 102, is formed as a substantially square hole and each inner corner of the square hole is rounded. As a result, during the assembling operation of the ceramic base 101 and the copper plate 109, concentration of mechanical stresses toward the square hole can be prevented by the rounded corners, so as not to destroy the ceramic base 101.

As mentioned above, a semiconductor device constructed according to the present invention has good heat-resisting durability and, therefore, it can withstand tests as severe as that of U.S. MIL (Standard 883A, Method 1011.1, Condition C).

In FIG. 5 of the drawings, the numerals 104a through 104d denote the connecting terminals for power and the external connecting terminals for ground, having large cross-sections, and other numerals 104 denote the external connecting terminals for signals, having small cross-sections.

In the above described semiconductor device, heat generated from the semiconductor chip 102 during operation, is conducted from the molybdenum plate 110 to the copper plate 109 to the molybdenum plate 111 to the cooling stud 107 to the cooling fins 108, and from the cooling fins the heat can be rapidly radiated to the surroundings. Since the heat conductivity of the high-heat conductivity metal plate 100 is higher than that of the ceramic plate or beryllia plate, which are utilized in the prior-art device, heat generated in the semiconductor chip 102 can be satisfactorily transferred in the direction of the cooling stud 107. Furthermore, since the thermal expansion coefficients of the semiconductor chip 102 and the molybdenum plate 110, on which the semiconductor chip 102 is adapted to receive, are substantially equal, neither mechanical nor thermal stresses are caused on the semiconductor chip 102, and consequently, there are no cracks caused on the semiconductor chip.

In addition, since the cooling stud 107, performed with the cooling fins 108 into a single structure, is bonded on the molybdenum plate 111 by means of resin, assembling of the device is rather easy and during the assembling operation there is no pressure applied on the ceramic base 101 or the external connecting terminals 104 which could deform or destroy them. After the bonding between the molybdenum plate 111 and the cooling stud 107 has been completed, the thermal stresses caused by the difference in thermal expansion coefficients, of the cooling stud 107 and the ceramic base 101, can be prevented by the metal plate formed of rigid material, such as molybdenum, which is interposed between the ceramic base 101 and the cooling stud 107. Since the thickness of resin or soldering material 114 is less than 100 um, and the copper plate 109 and the molybdenum plate 111 are provided for heat conducting from the semiconductor chip 102, the thermal resistances of this device are very much reduced compared to the former prior-art device.

Also, since the supporting member for the semiconductor chip 102 utilizes a ductile metal 109, such as oxygen-free copper, and the cooling stud 107 and the fins 108 are formed in one body, the manufacturing cost of the device according to the present invention is cheaper than that of the conventional device. In addition, this device does not utilize an expensive material like beryllia as in the later prior-art device.

Therefore, according to the present invention, a good heat conduction from the semiconductor chip can be provided, and a good thermal and mechanical durability of each of the elements can be obtained during assembly and operation of the device. Consequently, the present invention provides a semiconductor device which is reliable in operation, and which can receive a semiconductor chip having a high-power and high-integration, at a rather inexpensive manufacturing cost.

We claim:

1. In a semiconductor device having a semiconductor chip (102) in a through hole provided substantially in the central portion of a ceramic base (101), an improvement which comprises: a high-heat conductivity metal plate (100) which covers one side of said through-hole and which is secured to one of the major surfaces of said ceramic base (101); said high-heat conductivity metal plate (100) being a laminated single unitary structure formed by a ductile metal plate (109) and a molybdenum plate (111); said semiconductor chip (102) being secured through another molybdenum plate (110) onto the bottom of a recess formed by means of one side of said high-heat conductivity metal plate (100) and said through-hole of said ceramic base (101), said through-hole being formed substantially in a square configuration and each inner corner of the square hole being rounded; a cooling means (107, 108) being secured to the other side of said high-heat conductivity metal plate (100) by means of epoxy resin adhesive between opposed areas of said cooling means and said high-heat conductivity metal plate (100) thus making same substantially integral; and external connecting terminals (104, 104a, 104b, 104c, 104d) being provided on the other major surface of said ceramic base (101) and connected to the wire bonding pads of said semiconductor chip (102).

2. A device as in claim 1, wherein said cooling means (107, 108) includes a cooling (107) stud formed integral with fins (108) arranged in the form of a concentric circle.

3. A device as in claim 1, wherein said ductile metal plate (109) includes an oxygen-free copper plate.

4. A semiconductor heat radiating device comprising:
a ceramic base having a through-hole provided centrally thereof, said through-hole being formed substantially in a square configuration and each inner corner of the square hole being rounded;
a high-heat conductivity composite metal plate secured to one side of said ceramic base and covering one end of said through-hole;
said high-heat conductivity composite metal plate being formed of laminations consisting of a ductile metal plate and a molybdenum plate formed together;
another molybdenum plate securing said semiconductor chip to said high-heat conductivity composite metal plate;
cooling structure being provided for said device; and
means for securing said cooling means to the opposite side of said high-heat conductivity composite metal plate from said semiconductor chip side and for providing a substantially integral composite structure.

5. A device as in claim 4, wherein said means for securing said cooling means to the other side of said high-heat conductivity composite metal plate includes an epoxy resin adhesive applied to opposing areas of said cooling means and said high-heat conductivity composite metal plate for the purpose of making them substantially integral.

6. A device as in claim 6, wherein said cooling structure includes a cooling stud having fins integral therewith and projecting outwardly therefrom in the form of a plurality of concentric circles.

7. A device as in claim 6, wherein said ductile metal plate consists of an oxygen-free copper plate.

* * * * *

UNITED STATES PATENT AND TRADEMARK OFFICE
CERTIFICATE OF CORRECTION

PATENT NO. : 4,340,902
DATED : July 20, 1982
INVENTOR(S) : Honda et al

It is certified that error appears in the above-identified patent and that said Letters Patent is hereby corrected as shown below:

```
Column 3, line 40, "with" s/b --which--;
          line 51, "plate, and;" s/b --plate; and,--.

Column 4, line 13, "abovemen-" s/b --above-men---;
          line 27, "3, and;" s/b --3; and,--.

Column 6, line 4, "performed" s/b --preformed--.

Column 8, line 17, "6" (second occurrence) s/b --5--.
```

Signed and Sealed this

Seventh Day of December 1982

[SEAL]

Attest:

GERALD J. MOSSINGHOFF

Attesting Officer — Commissioner of Patents and Trademarks